United States Patent
Ito et al.

(10) Patent No.: US 10,217,606 B2
(45) Date of Patent: Feb. 26, 2019

(54) CHARGED PARTICLE BEAM DRAWING METHOD AND CHARGED PARTICLE BEAM DRAWING APPARATUS

(71) Applicant: NuFlare Technology, Inc., Yokohama-shi (JP)

(72) Inventors: Rumi Ito, Yokohama (JP); Tomoo Motosugi, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/658,571

(22) Filed: Jul. 25, 2017

(65) Prior Publication Data
US 2018/0033592 A1 Feb. 1, 2018

(30) Foreign Application Priority Data
Jul. 29, 2016 (JP) .................................. 2016-150037

(51) Int. Cl.
*H01J 37/302* (2006.01)
*H01J 37/317* (2006.01)
*H01J 37/304* (2006.01)

(52) U.S. Cl.
CPC ........ *H01J 37/3023* (2013.01); *H01J 37/304* (2013.01); *H01J 37/3174* (2013.01); *H01J 2237/24585* (2013.01)

(58) Field of Classification Search
None
See application file for complete search history.

(56) References Cited

FOREIGN PATENT DOCUMENTS

| | | | |
|---|---|---|---|
| JP | 2001-249439 | 9/2001 | |
| JP | 2001249439 A * | 9/2001 | .............. G03F 1/00 |
| JP | 2002-99072 | 4/2002 | |
| JP | 2002099072 A * | 4/2002 | |
| JP | 2003-43661 | 2/2003 | |
| JP | 2003043661 A * | 2/2003 | .............. G03F 1/36 |

(Continued)

OTHER PUBLICATIONS

Satoru Nemoto et al. "Etch Characterization of Binary Mask Dependence on Mask Material and Resist Thickness for 22nm Mask Fabrication", Proc of SPIE vol. 7379, 2009, 10 pages.

*Primary Examiner* — Andrew Smyth
(74) *Attorney, Agent, or Firm* — Oblon, McClelland, Maier & Neustadt, L.L.P.

(57) ABSTRACT

In one embodiment, a charged particle beam drawing method includes calculating a resist film reduction amount caused by etching from data representing a relation between a resist area rate and a resist film reduction amount and from an area rate of a pattern to be drawn, calculating a remaining resist-film thickness distribution by employing both an initial thickness of the resist film and the resist film reduction amount, estimating a dimension distribution of the light-shielding film pattern from the remaining resist-film thickness distribution, creating a first dimension correction map by determining a dimension correction amount from the estimated dimension distribution, creating a third dimension correction map by synthesizing a second dimension correction map to correct a relatively macroscopic dimensional variation and the first dimension correction map, and calculating an irradiation dose of the charged particle beam by employing the third dimension correction map.

9 Claims, 9 Drawing Sheets

(56) References Cited

FOREIGN PATENT DOCUMENTS

| | | | |
|---|---|---|---|
| JP | 2004-279950 | 10/2004 | |
| JP | 2004279950 A * | 10/2004 | |
| JP | WO 2004090635 A1 * | 10/2004 | ............... G03F 1/80 |
| JP | 2008-123000 | 5/2008 | |
| JP | 2008123000 A * | 5/2008 | |
| JP | 2011-198922 | 10/2011 | |
| JP | 2011198922 A * | 10/2011 | |
| WO | WO 2004/090635 A1 | 10/2004 | |

* cited by examiner

CHARGED PARTICLE BEAM DRAWING METHOD AND CHARGED PARTICLE BEAM DRAWING APPARATUS

CROSS REFERENCE TO RELATED APPLICATION

This application is based upon and claims benefit of priority from the Japanese Patent Application No. 2016-150037, filed on Jul. 29, 2016, the entire contents of which are incorporated herein by reference.

FIELD

The present invention relates to a charged particle beam drawing method and a charged particle beam drawing apparatus.

BACKGROUND

The increasing integration of LSIs has led to finer and finer circuit line widths of semiconductor devices. An approach employed to form desired circuit patterns on semiconductor devices uses a step-and-repeat exposure system to reduce and transfer, onto a wafer, a high-precision master pattern (also called a mask, or a reticle particularly when used in a stepper or scanner) formed on a piece of quartz. The high-precision original pattern is written with an electron beam writing apparatus by use of a so-called electron beam lithography technique.

In drawing with an electron beam, a correction process is needed to change a beam irradiation dose such that dimensions of drawing patterns are kept the same as those of design data. The correction process is performed on factors causing variations in the pattern dimensions, such as the proximity effect, the fogging effect, and the loading effect.

In the lithography technique using an electron beam, a resist pattern is formed, for example, by coating a substrate surface with a resist film, irradiating the resist film with an electronic beam, and by performing a development process. Then, an underlying chromium film (light-shielding film) is subjected to etching with the resist pattern used as a mask.

It is known that a CD (Critical Dimension) of the chromium film is different between when a thickness of the resist film after etching the chromium film is thick and when it is thin (see, e.g., Satoru Nemoto et al., "Etch Characterization of Binary Mask Dependence on Mask Material and Resist Thickness for 22 nm Mask Fabrication", Proc. of SPIE Vol.7379,737907,2009). In the related-art correction process, therefore, a correlation table between the thickness of the resist film after the etching and a CD distribution of the chromium film is prepared, and a film thickness characteristic of the resist film after the etching is measured. Then, a thickness of the resist film after the etching is calculated from an initial thickness of the resist film and the film thickness characteristic of the resist film after the etching. Then, a CD distribution of the chromium film is estimated from the calculated film thickness and the correlation table. Then, a dimension correction amount for the chromium film at each position on the substrate is determined to prepare a dimension correction map. An irradiation dose of the electron beam at each position on the substrate is calculated on the basis of the dimension correction map, and the electron beam is applied in accordance with the calculated irradiation dose (see, e.g., Japanese Unexamined Patent Application Publication No. 2011-198922).

With further miniaturization of semiconductor elements, it is demanded to more accurately calculate the thickness of the resist film after the etching, to correct the irradiation dose of the electron beam, and to increase drawing accuracy.

DETAILED DESCRIPTION

In one embodiment, a charged particle beam drawing method includes irradiating a resist film on a substrate with a charged particle beam, forming a resist pattern, etching a light-shielding film lying under the resist film with the resist pattern used as a mask, and forming a light-shielding film pattern. The method includes calculating a resist film reduction amount caused by etching from data representing a relation between a resist area rate and a resist film reduction amount and from an area rate of a pattern to be drawn, calculating a remaining resist-film thickness distribution by employing both an initial thickness of the resist film and the resist film reduction amount, estimating a dimension distribution of the light-shielding film pattern from the remaining resist-film thickness distribution, creating a first dimension correction map by determining a dimension correction amount from the estimated dimension distribution, creating a third dimension correction map by synthesizing a second dimension correction map to correct a relatively macroscopic dimensional variation and the first dimension correction map, and calculating an irradiation dose of the charged particle beam by employing the third dimension correction map.

Embodiments of the present invention will be described below with reference to the drawings.

First Embodiment

Figure 1:
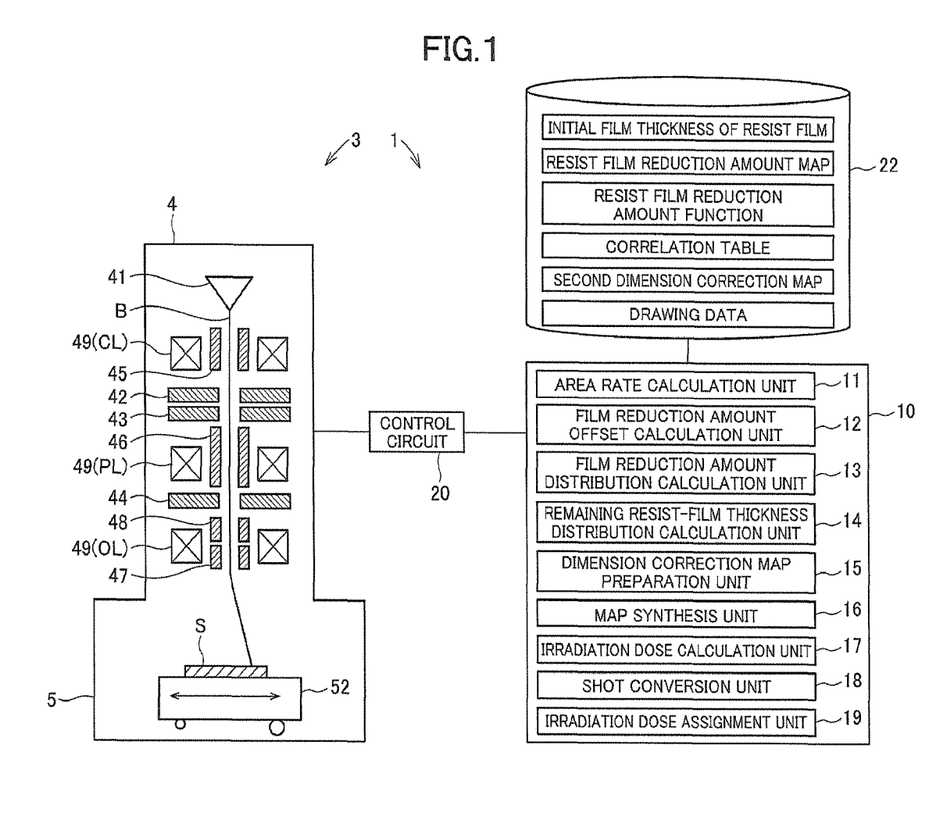
FIG. 1 is a schematic view of an electron beam drawing apparatus according to a first embodiment of the present invention.

FIG. 1 is a schematic view of an electron beam drawing apparatus according to a first embodiment of the present invention. The electron beam drawing apparatus illustrated in FIG. 1 is a drawing apparatus of variable shaping type including a control section 1 and a drawing section 3.

The control section 1 includes a control computer 10, a control circuit 20, and a storage unit 22. Drawing data, i.e., layout data, and various data used in later-described correction of an irradiation dose are input to the storage unit 22 from the outside and are stored therein. The storage unit 22 may be constituted by a plurality of storage devices.

The control computer 10 includes an area rate calculation unit 11, a film reduction amount offset calculation unit 12, a film reduction amount distribution calculation unit 13, a remaining resist-film thickness distribution calculation unit 14, a dimension correction map preparation unit 15, a map synthesis unit 16, an irradiation dose calculation unit 17, a shot conversion unit 18, and an irradiation dose assignment unit 19. The individual units of the control computer 10 may be constituted in the form of hardware, such as electrical circuits, or software. In the case of employing software, a program for realizing at least part of functions may be stored in a recording medium, and the program may be read to run by a computer including electrical circuits.

The drawing section 3 includes an electron tube 4 and a drawing chamber 5. An XY stage 52 movable in an X direction and a Y direction is arranged in the drawing chamber 5. A substrate S as a drawing target is placed on the XY stage 52. The substrate S is prepared, for example, by forming a chromium (Cr) film, which serves as a light-shielding film, on a mask substrate made of, e.g., quartz, and by forming a resist film on the chromium film. A molybdenum silicon (MoSi) film or the like may be used instead of the chromium film. The resist film may be a film that is formed using a chemically amplified resist.

An electron gun 41, a blanking aperture 42, a first shaping aperture 43, a second shaping aperture 44, a blanking deflector 45, a shaping deflector 46, a main deflector 47, an auxiliary deflector 48, and lenses 49 (including an illumination lens CL, a projection lens PL, and an objective lens OL) are arranged inside the electron tube 4.

Whether an electron beam B emitted from the electron gun 41 (emitter) is applied to the substrate S or not is switched over by the blanking deflector 45.

Figure 2:
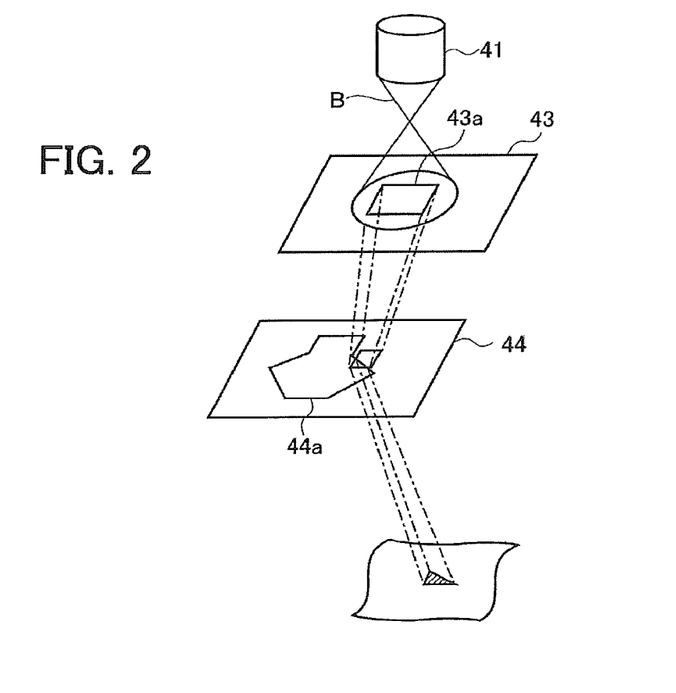
FIG. 2 is an illustration referenced to explain variable shaping of an electron beam.

The electron beam B is applied, through the illumination lens CL, to the entirety of the first shaping aperture 43 that has a rectangular opening 43a (see FIG. 2). The electron beam B is shaped into a rectangular form after passing through the opening 43a of the first shaping aperture 43.

The electron beam B in the form of a first aperture image after passing through the first shaping aperture 43 is projected, through the projection lens PL, onto the second shaping aperture 44 that has a variable shaping opening 44a (see FIG. 2). At that time, the first aperture image projected onto the second shaping aperture 44 is deflected under control by the shaping deflector 46 in such a manner that a shape and dimensions of the electron beam passing through the variable shaping opening 44a can be changed (namely that variable shaping of the electron beam can be performed).

The electron beam B having passed through the variable shaping opening 44a of the second shaping aperture 44 is focused by the objective lens OL, deflected by the main deflector 47 and the auxiliary deflector 48, and is applied to the substrate S placed on the XY stage 52 that is continuously moved.

Figure 3:
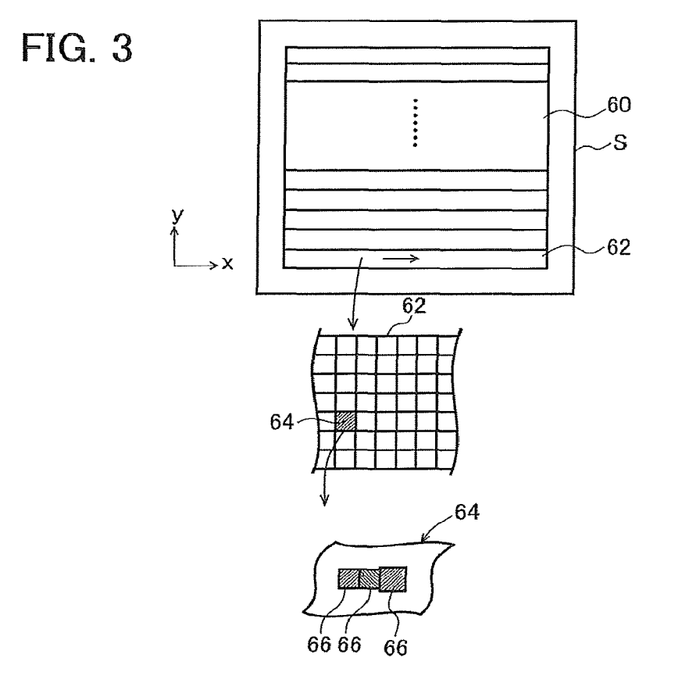
FIG. 3 is an illustration referenced to explain a drawing method with the electron beam.

FIG. 3 is an illustration referenced to explain a drawing method with the electron beam. As illustrated in FIG. 3, a drawing region 60 of the substrate S is virtually divided into a plurality of stripe regions 62 each of which has a strip-like form and is defined depending on a deflection width of the main deflector 47. Drawing with the electron beam is performed for each of the stripe regions 62 while the XY stage 52 is continuously moved in one direction (e.g., in the X direction).

The stripe regions 62 are each virtually divided into a plurality of mesh-like sub-fields (SF) 64 in units of a size deflectable by the auxiliary deflector 48. A shot figure is drawn at a shot position 66 of each SF 64.

A mask is manufactured through several steps of, for example, applying the electron beam, developing the resist film, and etching the chromium film. In the pattern formed through those steps, a pattern dimension and a design dimension are finished substantially same in a microscopic view. Looking at the entirety of the mask, however, there is a problem of the so-called relatively macroscopic dimensional variation, i.e., a problem that the pattern dimension is gradually changed and a difference between the pattern dimension and the design dimension is moderately changed.

The above problem is caused due to various factors, for example, that electrons applied to the resist film are reflected by a surface of the resist film and are applied to the resist film again after being reflected by optical components of the electron beam drawing apparatus, that the substrate S is supported in a slightly-inclined state, and that dimensions are varied depending on locations in accordance with characteristics of the etching and the apparatus.

A region where the relatively macroscopic dimensional variation occurs has a size in units of centimeter. Looking microscopically at a smaller region with a size of several ten to several hundred microns, therefore, dimensional changes in such a small region can be regarded as uniform. In consideration of the above point, a correlation between positions on the mask and dimensional variations and a correlation between pattern characteristics and dimensional variations are examined in advance, those correlations being obtained when an apparatus group (including the electron beam drawing apparatus, a development apparatus, and an etching apparatus) to be used in manufacturing the mask is actually employed. At the time of fabricating the mask with the apparatus group, a dimension correction amount is determined by utilizing data of the above-described correlations for each of small regions in which the dimensional variations fall within an allowable range, and a dimension correction map representing the dimension correction amounts is prepared. Such a dimension correction map is called a second dimension correction map. As described later, the second dimension correction map is used to calculate an irradiation dose of the electron beam at each position on the mask.

Figure 4A:
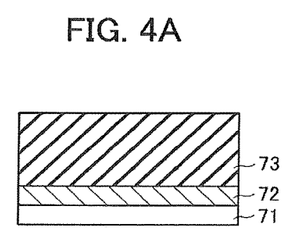
FIG. 4A is a sectional view of a mask substrate before irradiation with the electron beam.

A thickness of the resist film exhibits an in-plane distribution even in the same sample. FIGS. 4A, 4B, 4C, 5A, 5B and 5C each depict a relation between the thickness of the resist film and a CD (Critical Dimension) distribution of the chromium film. FIGS. 4A and 5A are each a sectional view of a mask in which a chromium film 72 and a resist film 73 are successively formed on a mask substrate 71. The resist film 73 is in a state before irradiation with the electron beam. The resist film 73 illustrated in FIG. 5A has a smaller thickness than the resist film 73 illustrated in FIG. 4A.

Figure 4B:
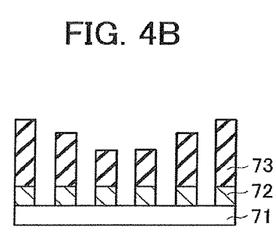
FIG. 4B is a sectional view of the mask substrate after an etching process.
Figure 4C:
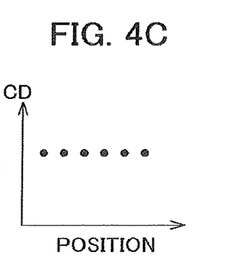
FIG. 4C is a graph depicting a CD distribution of a chromium film.
Figure 5A:
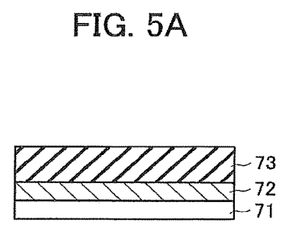
FIG. 5A is a sectional view of a mask substrate before irradiation with the electron beam.
Figure 5B:
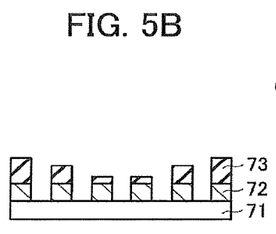
FIG. 5B is a sectional view of the mask substrate after an etching process.
Figure 5C:
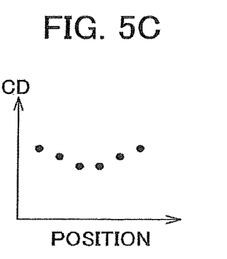
FIG. 5C is a graph depicting a CD distribution of a chromium film.

FIGS. 4B and 5B are each a sectional view after etching of the chromium film 72, the view schematically depicting a film thickness distribution of the resist film 73 after the etching. It is assumed that etching conditions are the same in both the cases of FIGS. 4B and 5B. FIGS. 4C and 5C each depict a CD distribution of the chromium film 72 in a mask plane.

As illustrated in FIGS. 4B and 5B, film reduction occurs in the resist film 73 with the etching of the chromium film 72. The thickness of the resist film 73 after the film reduction is not constant in the mask plane, and exhibits a variation. There is a tendency, for example, that the thickness of the resist film 73 reduces at a center of the mask and thereabout, and it gradually increases toward a periphery portion.

When the initial thickness of the resist film (i.e., the film thickness before the irradiation with the electron beam) is sufficient as illustrated in FIGS. 4A and 4B, a sufficient film thickness remains in spite of the variation in the thickness of the resist film after the etching. Therefore, a CD error hardly occurs in the chromium film 72 as illustrated in FIG. 4C.

On the other hand, when the thickness of the resist film is thin as illustrated in FIGS. 5A and 5B, the thickness of the resist film after the etching is very small and a CD error occurs in the chromium film 72 as illustrated in FIG. 5C.

Furthermore, the inventors have found that a resist area rate affects a resist film reduction amount (i.e., a resist film thickness reduction amount) caused by the etching, and that the resist film reduction amount increases as the resist area rate reduces.

Focusing attention to such a phenomenon, in this embodiment, the resist film reduction amount caused by the etching is calculated to determine a remaining resist film thickness (i.e., the thickness of the resist film after the etching), and a CD correction amount for the chromium film is calculated for each position on the mask to correct the irradiation dose of the electron beam.

A drawing method including an irradiation dose correction process, according to this embodiment, will be described with reference to a flowchart of FIG. 6.

First, a plurality of substrates is prepared. The substrates are each obtained, for example, by laminating a light-shielding film and a resist film on a quartz substrate. An initial thickness of the resist film is measured at each of plural points on a substrate surface. Then, evaluation patterns having different pattern area rates (densities) from each other are drawn on the substrates, respectively, by employing a drawing apparatus (step S1). Island patterns uniformly arranged over the entire substrate surface as illustrated in FIG. 7, by way of example, are drawn as the evaluation patterns. The evaluation patterns are just required to have patterns uniformly arranged over the substrate, and they may be line-and-space patterns, for example.

When the resist film is of the negative type, (pattern area rate [%]=resist area rate [%]) is held, and the beam is applied to the entire substrate surface at the resist area rate of 100%. On the other hand, when the resist film is of the positive type, (pattern area rate [%]=100−resist area rate [%]) is held, and the beam is not applied to the substrate at the resist area rate of 100%.

A resist pattern is formed by performing a development process, and the underlying light-shielding film is etched with the resist pattern used as a mask (step S2). After the etching, a thickness of the remaining resist film is measured at each of the plural points on the substrate surface (step S3).

An amount by which the resist film has been reduced by the etching is calculated by subtracting the remaining resist film thickness measured in the step S3 from the initial thickness of the resist film, which has been measured in advance. A resist film reduction amount map is prepared (step S4) by calculating the resist film reduction amount for each of the measuring points for the thickness of the resist film. The resist film reduction amount map is prepared for each substrate (i.e., for each area rate). Here, the area rate corresponds to the pattern area rate of the evaluation pattern drawn in the step S1.

Figure 8:
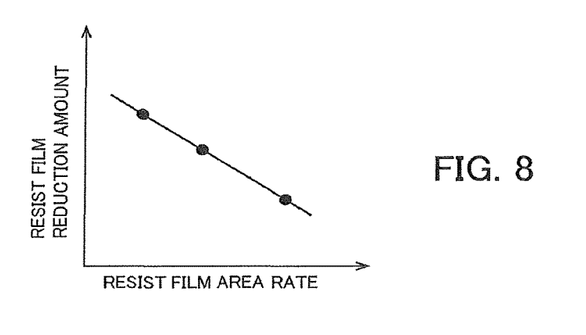
FIG. 8 is a graph depicting an example of a resist film reduction amount function.

The resist film reduction amount for each resist area rate is calculated. For example, an average value of the resist film reduction amounts measured at the plural measurement points is calculated as the resist film reduction amount at the relevant resist area rate. Then, as depicted in FIG. 8, fitting to a relation between the resist area rate and the resist film reduction amount is performed with the aid of a function (step S5). Such a function is called a resist film reduction amount function hereinafter. The resist film reduction amount function may be a linear expression, or a second or higher-order polynomial expression. In an example depicted in FIG. 8, assuming that the resist area rate is denoted by x and the resist film reduction amount is denoted by y, the resist film reduction amount function is expressed by y=ax.

After removing the resist film, a CD (Critical Dimension) of a light-shielding film pattern is measured (step S6).

A correlation table between the remaining resist film thickness and a CD distribution of the light-shielding film is prepared (step S7) from both the remaining resist film thickness measured in the step S3 and the CD measured in the step S6.

The above-described second dimension correction map, the resist film reduction amount map prepared in the step S4, the resist film reduction amount function prepared in the step S5, and the correlation table prepared in the step S7 are input to the drawing apparatus and are stored in the storage unit 22 (step S8). For example, three maps corresponding to the resist area rates of 100%, 50% and 30% are input as the resist film reduction amount map.

In addition, initial film thickness data of the resist film formed on the substrate S that is the drawing target, and drawing data, i.e., base data of patterns to be drawn on the substrate S, are also input to the drawing apparatus and are stored in the storage unit 22. The drawing data is data resulting from converting the format of design data (CAD data) to be capable of being arithmetically processed in the drawing apparatus.

The control computer 10 reads the data stored in the storage unit 22. Then, the area rate calculation unit 11 calculates a resist area rate (pattern area rate) x1 of the pattern, which is to be drawn on the substrate S, from the drawing data (step S9).

The film reduction amount offset calculation unit 12 selects, from the area rates for which the resist film reduction amount maps are prepared, an area rate x2 closest to the area rate x1 that has been calculated in the step S9. For example, when three resist film reduction amount maps are prepared corresponding to the area rates of 100%, 50% and 30% and the area rate x1 calculated in the step S9 is 45%, the closest area rate x2 is 50%.

The film reduction amount offset calculation unit 12 puts the difference between the area rates x1 and x2 in the resist film reduction amount function, and calculates an offset of the resist film reduction amount (step S10). For example, when the resist film reduction amount function is y=ax, the offset is a(x2−x1).

The resist-film reduction amount distribution calculation unit 13 adds the offset calculated in the step S10 to the resist film reduction amount map at the area rate x2, thereby determining the resist film reduction amount distribution (map) at the area rate x1 through calculation (step S11).

The remaining resist-film thickness distribution calculation unit 14 calculates a remaining resist-film thickness distribution (step 12) by employing both the resist film initial thickness data and the resist film reduction amount distribution calculated in the step 11. The calculated remaining resist-film thickness distribution represents a distribution of the remaining resist film thickness after the etching.

The dimension correction map preparation unit 15 estimates a CD distribution of the light-shielding film after the etching from both the remaining resist-film thickness distribution calculated in the step S12 and the above-described correlation table. Then, the dimension correction map preparation unit 15 determines dimension correction amounts of the light-shielding film at individual positions on the substrate from both design values and the estimated CD distribution, thereby preparing a first dimension correction map (step S13).

The map synthesis unit 16 synthesizes the first dimension correction map and the second dimension correction map to prepare a third dimension correction map (step S14). The third dimension correction map is prepared, for example, by adding a dimension correction amount of the light-shielding film, which is determined from the first dimension correction map, and a dimension correction amount that is determined from the second dimension correction map.

The irradiation dose calculation unit 17 calculates an irradiation dose of the electron beam at each position in the drawing region by employing the third dimension correction map (step S15). Thus, the pattern dimension after the etching and the design dimension can be matched with each other regardless of the thickness of the resist film.

The irradiation dose of the electron beam at each position in the drawing region can be calculated using a known method. A method disclosed in Japanese Unexamined Patent Application Publication No. 2007-150243, for example, can be used. According to the disclosed method, at the beginning, a fogging-effect correction irradiation dose in a first mesh region is calculated, the first mesh region being obtained by dividing the drawing region into the mesh-like form in units of a first size. Then, a loading-effect correction dimensional value in a second mesh region is calculated, the second mesh region being obtained by dividing the drawing region into the mesh-like form in units of a second size. Then, an electron-beam reference irradiation amount map and a proximity-effect correction coefficient map in the second mesh region are prepared on the basis of the above-described correction dimensional value. Then, by employing those maps, a proximity-effect correction irradiation amount in a third mesh region is calculated, the third mesh region being obtained by dividing the drawing region into the mesh-like form in units of a third size that is smaller than the first size and the second size. Then, the irradiation dose of the electron beam at each position in the drawing region is calculated on the basis of the fogging-effect correction irradiation amount and the proximity-effect correction irradiation amount.

The shot conversion unit 18 executes a multi-stage data conversion process on the drawing data and generates shot data (step S16). The shot data includes information regarding a shot shape, a shot size, a shot position, and so on. The irradiation dose assignment unit 19 assigns an irradiation dose to the shot data on the basis of the irradiation dose calculated in the step S15.

Thereafter, the control circuit 20 controls the drawing section 3 in accordance with the shot data to irradiate the substrate S with the electron beam, whereby the drawing is carried out (step S17).

According to this embodiment, as described above, the resist film reduction amount corresponding to the area rate of the pattern to be drawn is determined, and the remaining resist film thickness after the etching is calculated. Then, the CD distribution of the light-shielding film pattern is estimated from the correlation table between the remaining resist film thickness and the CD distribution of the light-shielding film pattern and from the calculated remaining resist film thickness. Because of taking into consideration the fact that the resist film reduction amount caused by the etching varies depending on the resist area rate, it is possible to accurately calculate the remaining resist film thickness, and to estimate the CD distribution of the light-shielding film with high accuracy.

Drawing accuracy can be increased as a result of determining the dimension correction amount of the light-shielding film from the CD distribution that has been estimated with high accuracy, calculating the irradiation dose of the electron beam in consideration of the determined dimension correction amount, and applying the electron beam in accordance with the calculated irradiation dose.

Second Embodiment

While, in the above first embodiment, the resist film reduction amount corresponding to the resist area rate is defined with a function as illustrated in FIG. 8, the resist film reduction amount map for each area rate may be expressed by a function in order to determine a resist-film reduction amount distribution function corresponding to the area rate of the pattern that is to be drawn.

Figure 9:
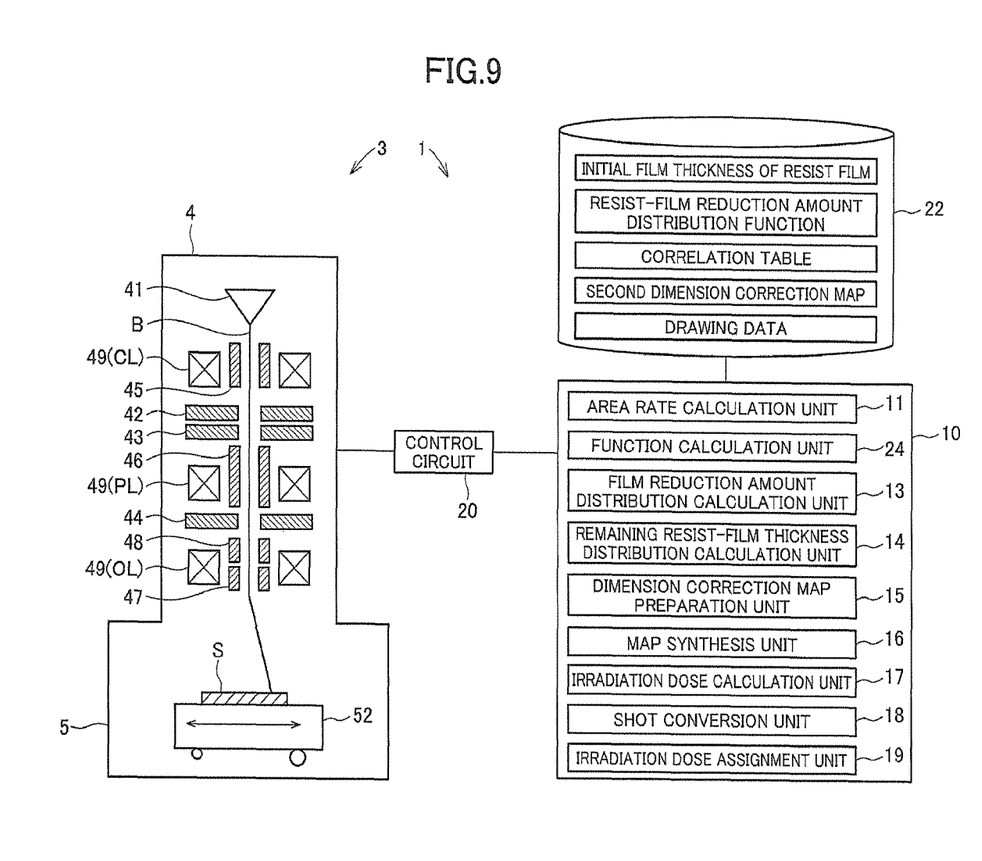
FIG. 9 is a schematic view of an electron beam drawing apparatus according to a second embodiment.

FIG. 9 is a schematic view of an electron beam drawing apparatus according to a second embodiment. The second embodiment is different from the first embodiment, illustrated in FIG. 1, in that the film reduction amount offset calculation unit 12 is omitted from the control computer 10, whereas a function calculation unit 24 is disposed, and that the resist film reduction amount map and the resist film reduction amount function are not stored in the storage unit 22, whereas the resist-film reduction amount distribution function is stored therein. A drawing method including an irradiation dose correction process, according to this embodiment, will be described with reference to a flowchart of FIG. 10.

Figure 6:
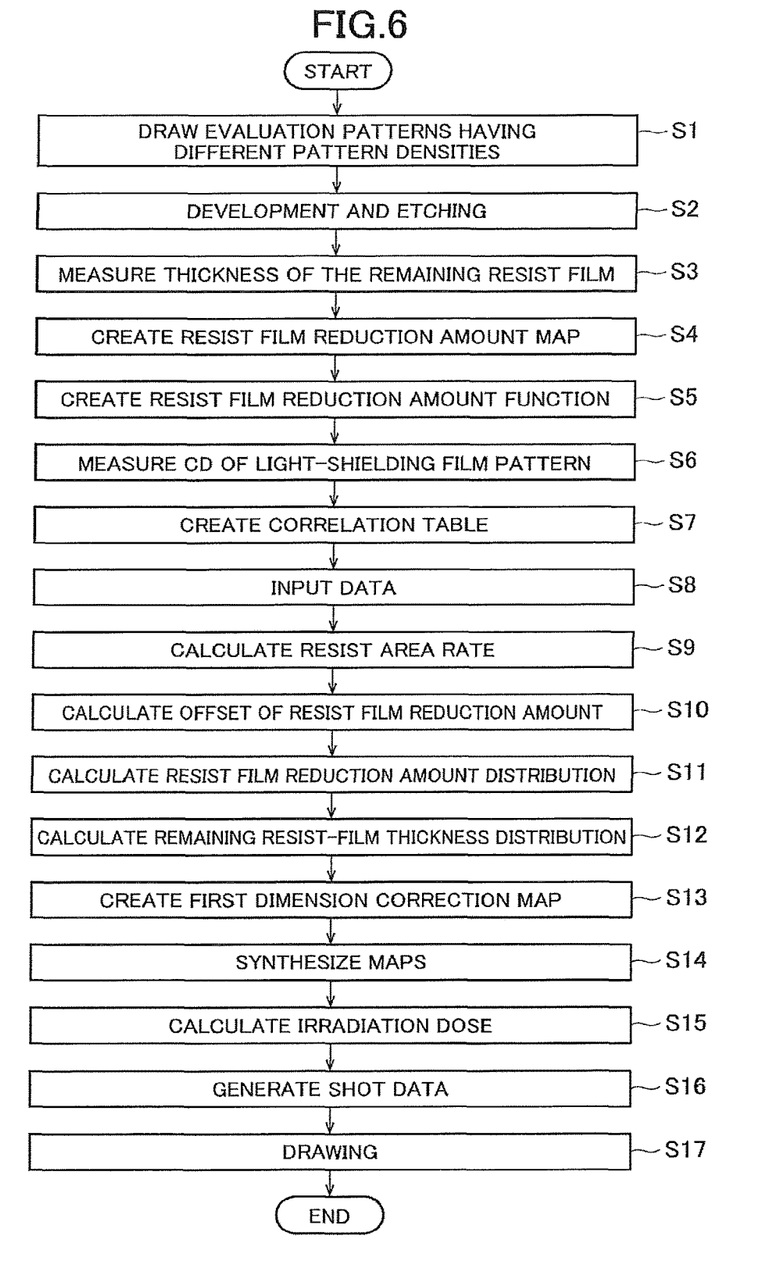
FIG. 6 is a flowchart referenced to explain a drawing method according to the first embodiment.
Figure 7:
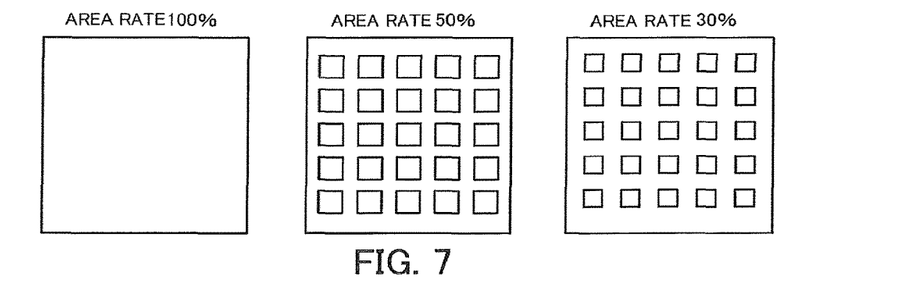
FIG. 7 illustrates examples of an evaluation pattern.
Figure 10:
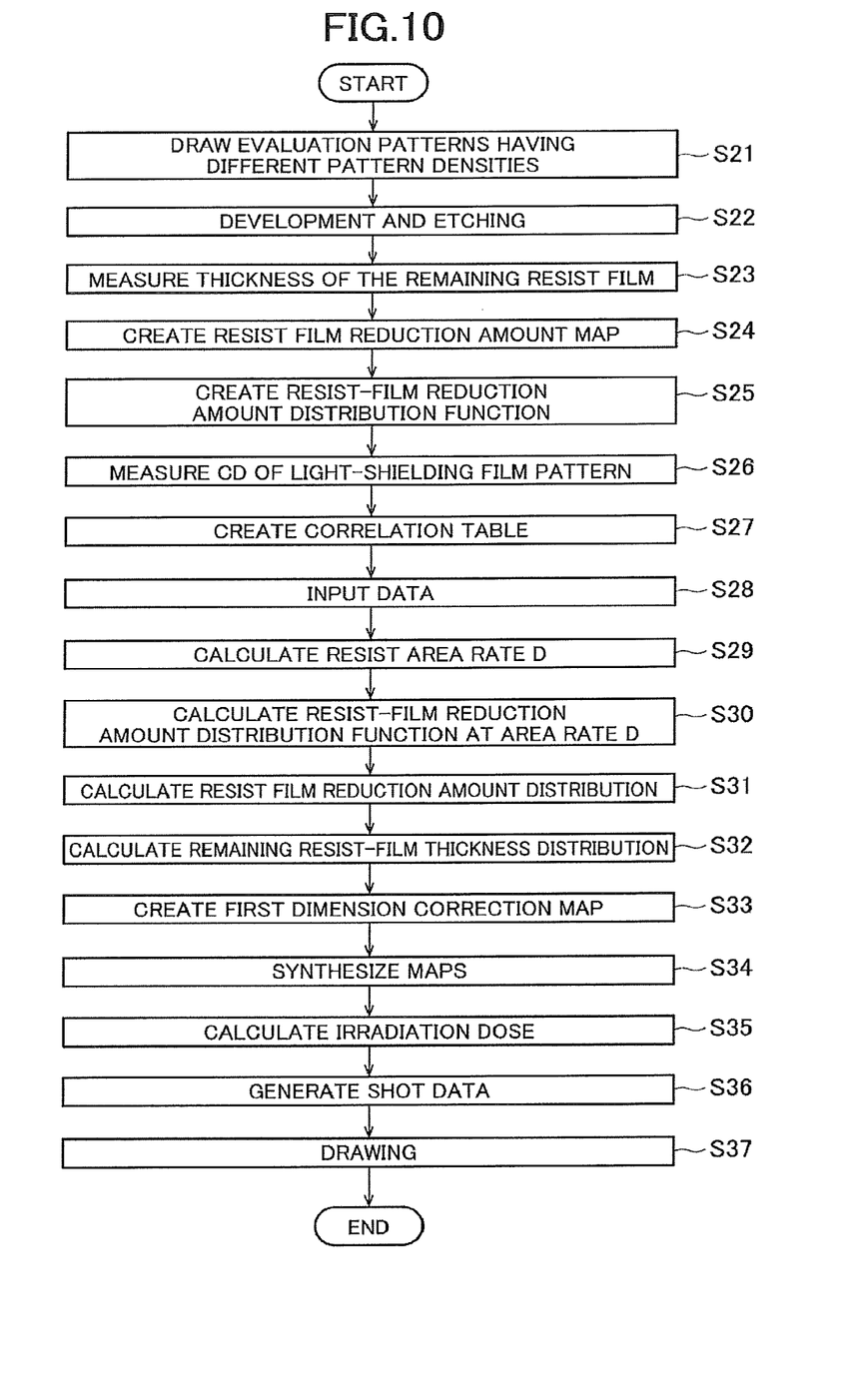
FIG. 10 is a flowchart referenced to explain a drawing method according to the second embodiment.

Operations in processes from drawing of the evaluation patterns having different resist area rates to preparation of the resist film reduction amount map (i.e., steps S21 to S24) are similar to those in the steps S1 to S4 in FIG. 6, and hence description of the steps S21 to S24 is omitted.

Function fitting is performed on the resist film reduction amount map for each area rate (step S25). For example, functions f(100), f(50), and f(30) for fitting to the resist film reduction amount maps with the area rates of 100%, 50%, and 30% are expressed as follows.

$$f(100)=a_0+a_1x+a_2y+a_3x^2+a_4xy+a_5y^2$$

$$f(50)=b_0+b_1x+b_2y+b_3x^2+b_4xy+b_5y^2$$

$$f(30)=c_0+c_1x+c_2y+c_3x^2+c_4xy+c_5y^2$$

Figure 11:
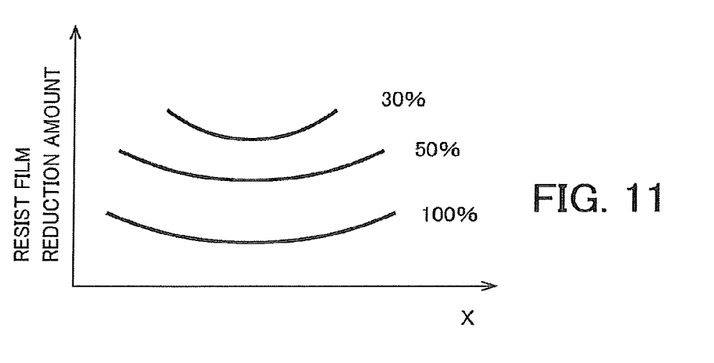
FIG. 11 is a graph depicting another example of the resist film reduction amount function.

Here, x and y denote coordinates on the substrate. The above functions are each called a resist-film reduction amount distribution function hereinafter. FIG. 11 depicts an example of the resist-film reduction amount distribution function when y is fixed to a certain value.

Operations of measuring the CD of the light-shielding film pattern and preparing the correlation table in steps S26 and S27 are the same as those in the steps S6 and S7 in FIG. 6, and hence description of the steps S26 and S27 is omitted.

The above-described second dimension correction map, the resist-film reduction amount distribution function calculated in the step S25, the correlation table prepared in the step S27, the resist film initial thickness data, and the drawing data are input to the drawing apparatus and are stored in the storage unit 22 (step S28).

The control computer 10 reads the data stored in the storage unit 22. Then, the area rate calculation unit 11 calculates a resist area rate (pattern area rate) D of the pattern, which is to be drawn on the substrate S, from the drawing data (step S29).

The function calculation unit 24 calculates the resist-film reduction amount distribution function f(D) at the area rate D (step S30). The function f(D) is expressed as follows, and the function calculation unit 24 determines coefficients $d_0$ to $d_5$.

$$f(x1)=d_0+d_1x+d_2y+d_3x^2+d_4xy+d_5y^2$$

Figure 12:
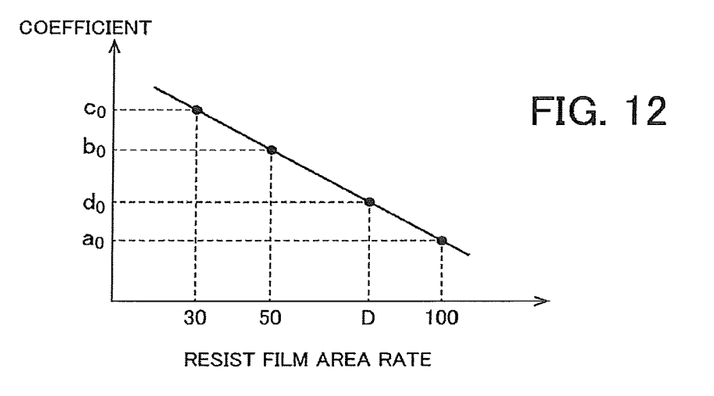
FIG. 12 is a graph referenced to explain a method of calculating the resist film reduction amount function.

The function calculation unit 24 determines the coefficients $d_0$ to $d_5$ of the function f(D) by employing coefficients $a_0$ to $a_5$, $b_0$ to $b_5$, and $c_0$ to $c_5$ of the functions f(100), f(50), and f(30). For example, as illustrated in FIG. 12, the coefficient $d_0$ at the area rate D is determined from the coefficients $a_0$, $b_0$ and $c_0$ at the area rates of 100%, 50% and 30%. The coefficients $d_1$ to $d_5$ can also be determined in a similar manner.

Using the function f(D) determined in the step S30, the resist-film reduction amount distribution calculation unit 13 calculates the resist-film reduction amount distribution at the area rate D (step S31).

Subsequent operations of calculating the remaining resist-film thickness distribution, preparing the first dimension correction map, calculating the irradiation dose, preparing the shot data, and carrying out the drawing (i.e., steps S32 to S37) are similar to the steps S12 to S17, and hence description of the steps S12 to S17 in FIG. 6 is omitted.

According to this embodiment, as described above, the resist-film reduction amount distribution function corresponding to the area rate of the pattern to be drawn is determined, and the remaining resist film thickness after the etching is calculated. Then, the CD distribution of the light-shielding film is estimated from the correlation table between the remaining resist film thickness and the CD distribution of the light-shielding film pattern and from the calculated remaining resist film thickness. As in the above first embodiment, because of taking into consideration the fact that the resist film reduction amount caused by the etching varies depending on the resist area rate, it is possible to accurately calculate the remaining resist film thickness, and to estimate the CD distribution of the light-shielding film with high accuracy.

Drawing accuracy can be increased as a result of determining the dimension correction amount of the light-shielding film from the CD distribution that has been estimated with high accuracy, calculating the irradiation dose of the electron beam in consideration of the determined dimension correction amount, and applying the electron beam in accordance with the calculated irradiation dose.

In the above first and second embodiments, the processing up to the preparation of the third dimension correction map may be performed in an external device.

While the above first and second embodiments have been described in connection with an example of drawing the evaluation patterns with the different resist area rates on the plurality of substrates, and then carrying out the development and the etching, a glass plate having the same shape as each of the evaluation patterns may be placed on a mask blank.

Because the resist film reduction amount map, the resist film reduction amount function, the correlation table, the resist film reduction amount distribution function, etc. are variable depending on the resist material, they are preferably prepared for each resist material. The term "resist" used herein stands for a film that serves as a cover when an etching target film is etched. Thus, the material of the resist is not limited to resin, and the resist may be made of Cr, MoSi, or a hard mask, for example.

Because the remaining resist film thickness after the etching varies depending on etching conditions during the etching, such as a gas flow rate, plasma power, pressure, and time, the resist film reduction amount map, the resist film reduction amount function, the correlation table, the resist film reduction amount distribution function, etc. may be prepared for each of plural sets of etching conditions.

While the drawing apparatus for applying the electron beam has been described in the above embodiments, the drawing apparatus may apply other charged particle beams, such as an ion beam.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam drawing method of irradiating a resist film on a substrate with a charged particle beam, developing the resist film to form a resist pattern, etching a light-shielding film lying under the resist film with the resist pattern used as a mask, and forming a light-shielding film pattern, the method comprising:

calculating an area rate of a pattern, which is to be drawn on the substrate, on the basis of drawing data;

calculating a resist film reduction amount caused by etching from data representing a relation between a resist area rate and a resist film reduction amount and from the calculated area rate;

calculating a remaining resist-film thickness distribution after the etching by employing both an initial thickness of the resist film before irradiation with the charged particle beam and the calculated resist film reduction amount;

estimating a dimension distribution of the light-shielding film pattern from data representing a correlation between a film thickness of the resist pattern and a dimension of the light-shielding film pattern, and from the calculated remaining resist-film thickness distribution;

creating a first dimension correction map by determining a dimension correction amount of the light-shielding film pattern from the estimated dimension distribution of the light-shielding film pattern and from a design dimension;

creating a third dimension correction map by synthesizing a second dimension correction map to correct a relatively macroscopic dimensional variation and the first dimension correction map;

calculating an irradiation dose of the charged particle beam by employing the third dimension correction map; and drawing the pattern by irradiating the resist film with the charged particle beam at the calculated irradiation dose.

2. The charged particle beam drawing method according to claim 1, wherein the data representing a relation between a resist area rate and a resist film reduction amount is a resist film reduction amount function representing a correspondence relation between a resist area rate and a resist film reduction amount, and the method further comprises calculating a resist film reduction amount offset by putting a difference between the area rate obtained from the drawing data and a predetermined resist area rate into the resist film reduction amount function; and determining a resist film reduction amount distribution by adding the resist film reduction amount offset to a resist film reduction amount distribution at the predetermined resist area rate to determine a resist film reduction amount distribution, and calculating the remaining resist-film thickness distribution after the etching from both the determined resist film reduction amount distribution and the initial thickness of the resist film.

3. The charged particle beam drawing method according to claim 2, wherein the resist film reduction amount function is derived by drawing evaluation patterns with different area rates, determining a resist film reduction amount for each of the area rates, and by approximating a relation between the area rate and the resist film reduction amount with a function.

4. The charged particle beam drawing method according to claim 1, further comprising:

drawing evaluation patterns with different area rates, and creating a resist film reduction amount map for each of the area rates;

approximating the resist film reduction amount map for each of the area rates with a function, and obtaining a resist-film reduction amount distribution function as data representing a relation between the resist area rate and the resist film reduction amount; and determining a resist film reduction amount distribution at a first area rate, which is determined from the drawing data, by employing the resist-film reduction amount distribution function for each of the area rates, and calculating the remaining resist-film thickness distribution after the etching from both the determined resist film reduction amount distribution and the initial thickness of the resist film.

5. The charged particle beam drawing method according to claim 4, further comprising:

deriving a resist-film reduction amount distribution function at the first area rate by employing the resist-film reduction amount distribution function for each of the area rates: and calculating the resist film reduction amount distribution at the first area rate by employing the derived resist-film reduction amount distribution function.

6. A charged particle beam drawing apparatus of irradiating a resist film on a substrate with a charged particle beam, the substrate including a light-shielding film pattern that is formed by developing the resist film to form a resist pattern, and by etching a light-shielding film lying under the resist film with the resist pattern used as a mask, the apparatus comprising:

a storage unit that stores data representing a relation between a resist area rate and a resist film reduction amount, drawing data, a second dimension correction map to correct a relatively macroscopic dimensional variation, data representing an initial film thickness of the resist film on the substrate, and data representing a correlation between a film thickness of the resist pattern and a dimension of the light-shielding film pattern;

an area rate calculation processing circuitry calculating an area rate of a pattern, which is to be drawn on the substrate, on the basis of the drawing data;

a film reduction amount distribution calculation processing circuitry calculating a resist film reduction amount distribution resulted with etching by employing both data representing the relation between the resist area rate and the resist film reduction amount and the calculated area rate;

a remaining film thickness distribution calculation processing circuitry calculating a remaining resist-film thickness distribution after the etching from both the initial film thickness and the calculated resist film reduction amount distribution;

a dimension correction map creating processing circuitry creating a first dimension correction map by estimating a dimension distribution of the light-shielding film pattern from both the data representing the correlation and the calculated remaining resist-film thickness distribution, and by determining a dimension correction amount of the light-shielding film pattern from both the estimated dimension distribution and a design dimension;

a map synthesis processing circuitry creating a third dimension correction map by synthesizing the first dimension correction map and the second dimension correction map;

an irradiation dose calculation processing circuitry calculating an irradiation dose of the charged particle beam by employing the third dimension correction map; and a drawing section drawing the pattern by irradiating the resist film with the charged particle beam at the calculated irradiation dose.

7. The charged particle beam drawing apparatus according to claim 6, wherein the data representing the relation between the resist area rate and the resist film reduction amount is a resist film reduction amount function representing a correspondence relation between the resist area rate and the resist film reduction amount, the apparatus further comprises a film reduction amount offset calculation processing circuitry calculating a resist film reduction amount offset by putting a difference between a first area rate obtained from the drawing data and a predetermined resist area rate into the resist film reduction amount function, the film reduction amount distribution calculation processing circuitry calculate a resist film reduction amount distribution at the first area rate by adding the calculated resist film reduction amount offset to a resist film reduction amount distribution at the predetermined resist area rate, and the remaining resist-film thickness distribution calculation processing circuitry calculates the remaining resist-film thickness distribution after the etching from both the calculated resist film reduction amount distribution and the initial thickness of the resist film.

8. The charged particle beam drawing apparatus according to claim 7, wherein the storage unit stores the resist film reduction amount function that is derived by drawing evaluation patterns with different area rates, and by determining a resist film reduction amount for each of the area rates.

9. The charged particle beam drawing apparatus according to claim 6, wherein the storage unit stores, as the data representing the relation between the resist area rate and the resist film reduction amount, a resist-film reduction amount distribution function that is derived by approximating a resist film reduction amount map for each of the area rates with a function,     the apparatus further comprises a function calculation processing circuitry calculating the resist-film reduction amount distribution function at a first area rate, which is obtained from the drawing data, by employing the resist-film reduction amount distribution function for each of the area rates, and     the film reduction amount distribution calculation processing circuitry calculates the resist film reduction amount distribution resulted with the etching by employing the resist-film reduction amount distribution function at the first area rate, the resist-film reduction amount distribution function being derived by the function calculation processing circuitry.

* * * * *